United States Patent [19]
Hartgring et al.

[11] Patent Number: 5,038,326
[45] Date of Patent: Aug. 6, 1991

[54] STATIC RAM HAVING A PRECHARGE OPERATION WHICH EXHIBITS REDUCED HOT ELECTRON STRESS

[75] Inventors: Cornelis D. Hartgring, Dublin, Ireland; Tiemen Poorter, Heerlen, Netherlands

[73] Assignee: U.S. Philips Corp., New York, N.Y.

[21] Appl. No.: 617,306

[22] Filed: Nov. 19, 1990

Related U.S. Application Data

[63] Continuation of Ser. No. 272,663, Nov. 17, 1988, abandoned.

[30] Foreign Application Priority Data

Nov. 20, 1987 [GB] United Kingdom ............... 8727249

[51] Int. Cl.⁵ ............................................ G11C 11/413
[52] U.S. Cl. ................................. 365/203; 365/156; 365/190
[58] Field of Search ................. 365/154, 156, 189.09, 365/190, 203

[56] References Cited

U.S. PATENT DOCUMENTS

| | | | |
|---|---|---|---|
| 4,451,907 | 5/1984 | Donoghue | 365/190 |
| 4,623,989 | 11/1986 | Blake | 365/203 |
| 4,758,990 | 7/1988 | Uchida | 365/190 |
| 4,760,557 | 7/1988 | Stewart et al. | 365/156 |

FOREIGN PATENT DOCUMENTS 0009095 1/1988 Japan .................... 365/203

OTHER PUBLICATIONS

Gubbels et al., "A 40-ns/100-pF Low-Power Full CMOS 256K (32K×8) SRAM", IEEE Journal of Solid State Circuits, vol. SC-22, No. 5, Oct. 1987, pp. 741-747.

Primary Examiner—Glenn Gossage
Attorney, Agent, or Firm—Steven R. Biren

[57] ABSTRACT

A memory cell is read by first charging a pair of bit lines to given positive potentials and then raising the potential of a cell access line to render access transistors conductive. The cell supply voltage is sufficient to cause substantial hot-electron stress in the n-channel transistors of the cell if it were applied directly across their source-drain paths while they were conductive. However, a limit is imposed on the maximum positive potentials which are applied to the bit lines from the exterior, and on the minimum ratio of the sizes of the cell n-channel amplifier transistors to the sizes of the access transistors, taking into account the threshold voltages of the amplifier transistors, and as a result substantial hot-electron stress does not occur. Substantial hot-electron stress is also prevented during a write operation by arranging that this is effectively preceded by a read operation.

10 Claims, 2 Drawing Sheets

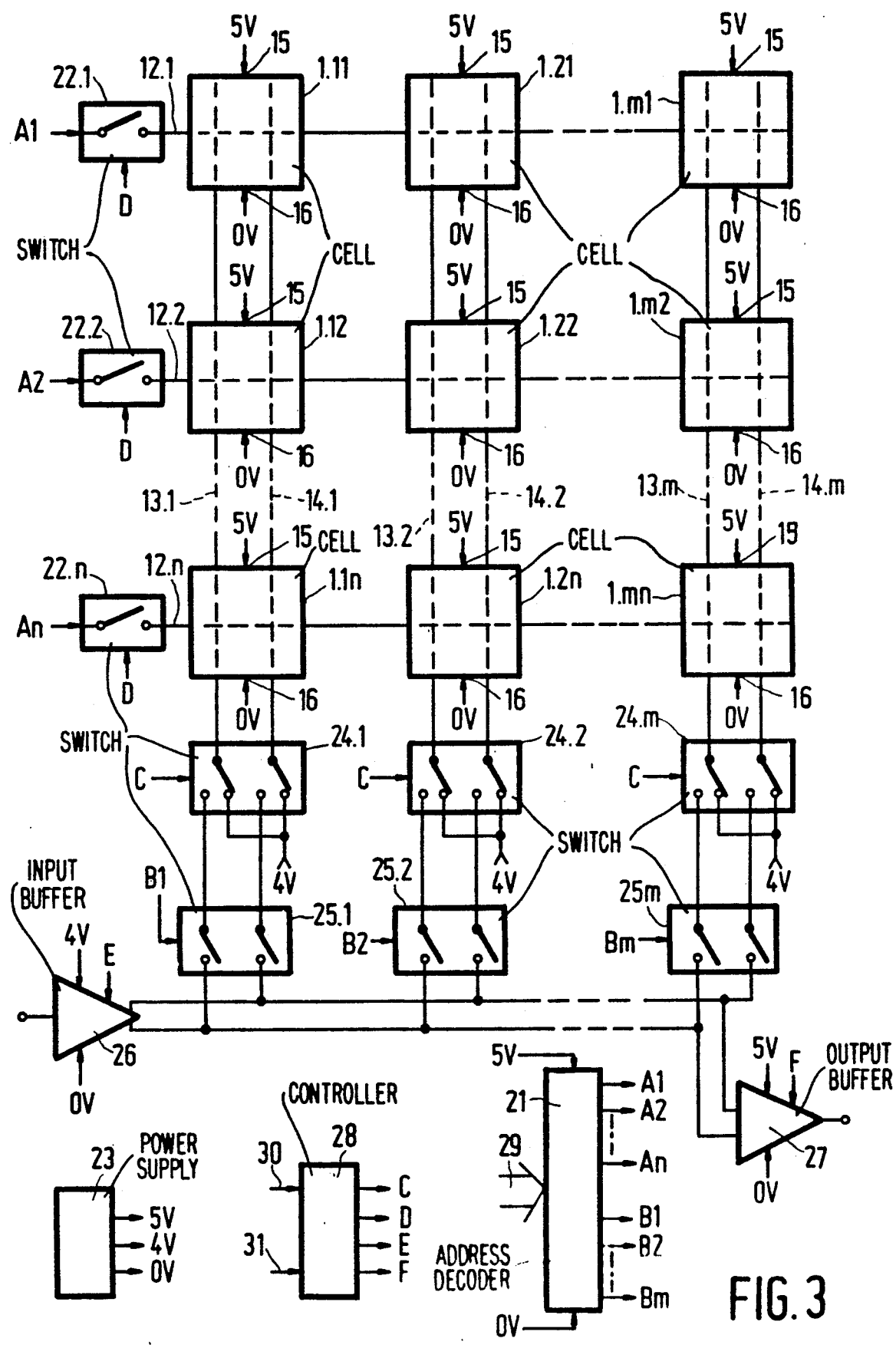

STATIC RAM HAVING A PRECHARGE OPERATION WHICH EXHIBITS REDUCED HOT ELECTRON STRESS

This is a continuation of application Ser. No. 272,663, filed Nov. 17, 1988, now abandoned.

BACKGROUND OF THE INVENTION

This invention relates to a memory having a CMOS SRAM-cell, the cell including a pair of cross-coupled inverters, and each inverter having a series connection of an inverter-PMOS-transistor and an inverter-NMOS-transistor between two supply terminals for receiving a supply voltage thereon. Outputs of the inverters are coupled to respective bit lines via respective NMOS-access-transistors, and the memory includes precharging means for precharging the bit lines to a predetermined precharging voltage before executing a read-operation.

A memory as defined above is disclosed in an article in IEEE Journal of Solid-State Circuits, Vol. SC-22, No. 5, October 1987 entitled "A 40-ns/100 pF Low-Power Full-CMOS 256K (32K×8) SRAM" by W. C. H. Gubbels et al. This article discusses an advanced SRAM which is constructed by means of a 1.3 μm process. Reliable transistors for a 5 V power supply are obtained using a lightly doped drain (LLD) structure for protecting the transistors against "hot electron stress". The hot-electron stress phenomenon is well-known per se, and is the result of charge carriers in the channel of the relevant transistor being accelerated by the source-to-drain electric field to sufficient energy to ionise the channel material on impact, so that valence band electrons of the channel material are excited into the conduction band. Each time such an event occurs the result is an extra conduction electron and a hole, which may flow to the drain and substrate respectively, giving rise to increased drain-source current and substrate current. If charge carriers generated by impact ionization have sufficient energy, they are able to surmount the energy barrier between the channel material and the insulating material for the transistor gate. Once in the insulating material some carriers become trapped, creating both fixed charge in the insulator and interface traps, which in turn give rise to a change in the transistor characteristics.

A present trend is a desire for memories having larger and larger storage capacities, and this implies a desire for a reduction in memory cell size in order that the larger number of cells required can be accommodated on a reasonably-sized area of substrate. A reduction in memory cell size entails a reduction in size of the constituent transistors of the cell. However, it has been found that if the channel lengths of the cell transistors are reduced to below 1 μm (submicron), for example to 0.8 μm while the operating conditions are maintained unchanged "hot-electron stress" occurs in the NMOS transistors in spite of using a lightly doped drain (LLD) structure for the transistors, resulting in a drastically reduced life expectancy for the cell. It will be evident that the hot-electron stress could be avoided if the voltages supplied to the cells were suitably reduced but it has been found that in general such reduction results in a considerable increase in the time required to access the cells. It is an object of the invention to mitigate this disadvantage.

SUMMARY OF THE INVENTION

According to a first aspect the invention provides a memory as defined above which is characterized in that the precharging voltage is well below the supply voltage so as to prevent hot electron stress from occurring in the respective access-transistor, and the transistors of each combination of an inverter-NMOS-transistor and an access-transistor having channels interconnected via a said output are realized such as to keep a voltage representing a low logical level, when such a voltage is present on the output, below a safety value that is substantially well below the threshold voltage of the other inverter-NMOS-transistor in order to prevent hot electron stress from occurring in the other inverter-NMOS-transistor.

(It should be noted that the term "CMOS" is used herein in the sense in which it is commonly employed, and in consequence is to be understood to embrace complementary transistor structures in which the transistor gate electrodes are composed of non-metallic materials, for example polysilicon).

The present invention is based upon the insight that in order to avoid the "hot electron stress" the maximum permissible voltage across the conduction channel of a NMOS-transistor depends on the voltage difference between the gate and source of the NMOS-transistor. The maximum permissible voltage is larger for a voltage difference between the gate and source of the NMOS-transistor that lies below the safety value than a voltage difference between the gate and source of the NMOS-transistor that lies above the safety value.

The invention may be characterized further in that the supply voltage is substantially 5 Volts, the precharging voltage lies between substantially 2.5 Volts and 4 Volts, and the safety value is equal to substantially said threshold voltage minus 0.3 Volts. It has been found that the above-mentioned voltage range for the precharging level and the specified safety value can prevent the occurrence of hot electron stress in NMOS-transistors which are constructed by means of a submicron process (e.g. 0.8 μm).

The invention may be characterized further in that the memory includes control means for executing each write operation in such manner that it is preceded by precharging. Thus, in order to prevent hot electron stress from occurring in the access-transistors, the control means precharge the bit lines (e.g. to a voltage level typically higher than 2.5 Volts (e.g. 4 V) in the case of a 5 Volts power supply) prior to a write operation. In effect the voltage occurring across the access-transistors is then substantially less than the supply voltage. Thereupon the control means turn on the access-transistors, after this the control means put the desired information on the bit lines to write the memory cell and thus the respective outputs of the inverters in the memory cell take over the information on the respective bit lines.

The invention may be characterized further in that the memory includes control means for executing each write operation in such manner that it is preceded by a read operation. The desired precharging of the bit lines and selecting of the access-transistors prior to the write operation as discussed in the preceding paragraph can be accomplished by a read operation.

BRIEF DESCRIPTION OF THE DRAWING

An embodiment of the invention will now be described, by way of example, with reference to the accompanying diagrammatic drawings, in which:

FIG. 3 is a circuit diagram of a static random access memory arrangement which includes cells as shown in FIG. 1.

DESCRIPTION OF THE PREFERRED EMBODIMENTS

Figure 1:
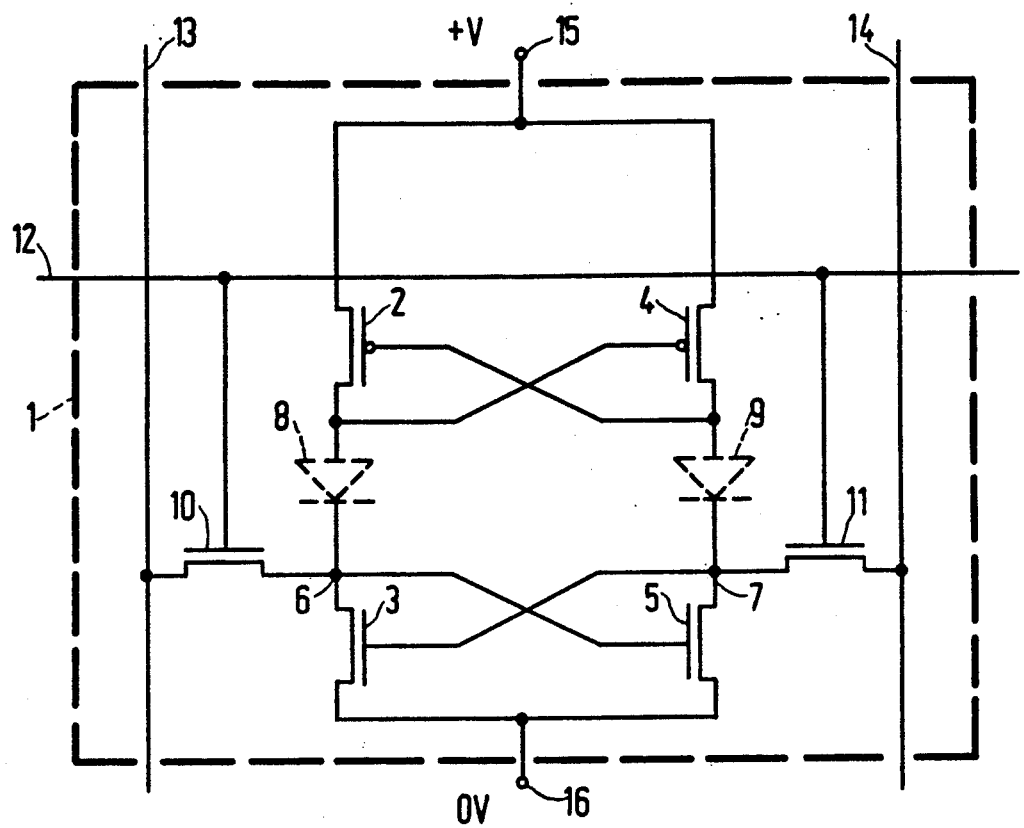
FIG. 1 is the circuit diagram of a static random access memory cell.

In FIG. 1, a static random access memory cell 1 comprises first and second CMOS inverting amplifiers 2, 3 and 4, 5 respectively which are cross-coupled so as to form an arrangement which has a first stable state in which the potential at the output 6 of the first amplifier is positive relative to the potential at the output 7 of the second amplifier, and a second stable state in which the reverse is the case. It will be noted that, as shown, the amplifiers are twice cross-coupled, diodes 8 and 9, shown in dashed lines, being present between the p-channel transistor 2 and the n-channel transistor 3, and between the p-channel transistor 4 and the n-channel transistor 5 respectively. These diodes may or may not be present in practice. The gate electrodes of further n-channel insulated-gate field-effect transistors 10 and 11 are connected to a cell access signal supply conductor (word line) 12, and their channels connect the outputs 6 and 7 to first and second information signal conductors (bit lines) 13 and 14 respectively. The CMOS amplifiers 2, 3 and 4, 5 are each connected between power supply conductors 15 and 16, conductor 15 carrying a positive potential V relative to conductor 16 which it will be assumed is at ground potential.

As is known, when it is required that the information content of the cell 1 be read out onto the information signal conductors or bit lines 13 and 14, a positive potential can be applied to the cell access signal supply conductor 12 to render the further or access transistors 10 and 11 conductive, the sign of the resulting potential difference between the lines 13 and 14 then being indicative of which bistable state is currently present. Normally the lines 13 and 14 are precharged to a positive potential, for example $+V$, before the access transistors 10 and 11 are rendered conductive, in order to prevent an accidental write operation in the cell when this conduction occurs. When a write operation is actually required suitable different potentials, for example $+V$ and zero respectively, the relative sign of which corresponds to the particular bistable state required can be impressed on the lines 13 and 14 and a positive potential can be applied to the line 12 to render the access transistors conductive, thereby setting the cell into the appropriate state if is it not already in this state. If the exemplary voltages quoted above are employed, and $V = +5$ volts $\pm 10\%$, then the cell described operates satisfactorily if the channel lengths of the n-channel and p-channel transistors of the cell are 1.2 $\mu$m and 1.4 $\mu$m respectively as above cell described in the article. However, if these channel lengths, particularly these of the n-channel transistors, are substantially reduced, for example to 0.8 $\mu$m, it is found that, when the exemplary voltages quoted above are employed and $V=5$ volts $\pm 10\%$, substantial hot-electron stress occurs in the n-channel transistors, with a concomitant reduction in their life expectancy. A reduction in V to a value such as to prevent the substantial hot-electron stress results in a very considerable increase in the cell access time. In an exemplary embodiment of the invention, however, in which the channel lengths of the n-channel transistors are reduced to 0.8 $\mu$m, the value of V is maintained at $+5$ volts, but the maximum positive voltage which is applied to the conductors 13 and 14 from the exterior is limited to $+4$ volts $\pm 10\%$ and the threshold voltages of the transistors 3 and 5, together with the ratios between the sizes (channel conductances) of the transistors 3 and 5 and those of the transistors 10 and 11 respectively are chosen in a particular way which will be discussed below with reference to FIG. 2. It has been found that, when this is done, substantial hot-electron stress in the n-channel transistors can be avoided without entailing the very considerable increase in cell access time which would occur if the potential difference between the conductors 15 and 16 were itself reduced.

Figure 2:
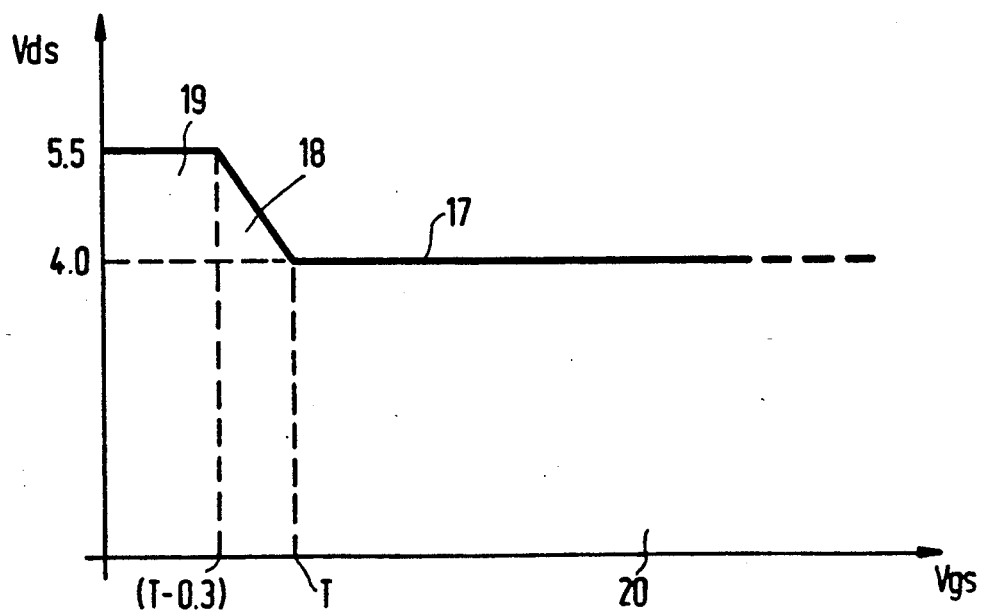
FIG. 2 is a diagram showing what has been found to be a "hot-electron safe" operating area for a particular construction of n-channel insulated-gate field-effect transistor structure.

The diagram of FIG. 2 shows what has been found to be the "hot-electron safe" working area of a particular n-channel insulated-gate field-effect transistor, this being the area below the full line 17. Drain-source voltage Vds has been plotted as the ordinate against gate-source voltage Vgs along the abscissa. It has been assumed that the maximum drain-source voltage possible is 5.5 volts, i.e. 5 volts $+10\%$. It will be seen that the transistor is "hot-electron safe" when its gate-source voltage is above its threshold voltage T provided that its drain-source voltage is limited to 4.0 volts under these conditions (region 20). On the other hand, the transistor is "hot-electron safe" when its drain-voltage is 5.5 volts only if its gate-source voltage does not exceed a value which is 0.3 volts below the threshold voltage T (region 19). There is an intermediate transition region 18 between these two situations. In fact there is not a sharp dividing line between what is, and what is not, "hot-electron safe". For example in some circumstances it may be permissible to increase the transistor gate-source voltage to within 0.25 volts of the threshold voltage T with a drain-source voltage of 5.5 volts before the resulting hot-electron stress reaches an impermissible magnitude. Moreover, the 4 volt level of the right-hand portion of the line 17 may in some circumstances be subject to a tolerance of 10%. When, therefore, the n-channel transistors in the cell of FIG. 1 conform to the diagram of FIG. 2, and the potential difference V between the conductors 15 and 16 is 5.5 volts, the operating points of these transistors must be kept below the line 17, or at least the line 17 after it has been subjected to the tolerance and condition relaxations quoted above. That this is in fact the case, provided that in accordance with the invention the maximum positive voltages on the conductors 13 and 14 are suitably limited and the threshold voltages of the transistors 3 and 5 together with the sizes of these transistors relative to the sizes of the transistors 10 and 11 are suitably chosen, will now be demonstrated.

Consider first the quiescent (not selected) state of the cell of FIG. 1, and assume for the sake of example that the cell is in a stable state in which output 6 of the amplifier 2, 3 is positive relative to the output 7 of amplifier 4, 5. In the quiescent state the line 12 is at ground potential so that transistors 10 and 11 are cut-off, isolating the cross-coupled inverting amplifiers 2, 3 and 4, 5 from the conductors 13 and 14. Hence within the cell the logic levels are CMOS logic levels, i.e. Vcc and ground. On the assumption that the threshold voltages of the n-channel transistors 3, 5, 10 and 11 are all about 1 volt, transistors 10, 11 and 3 operate in the low Vgs region 19 of FIG. 2 whereas transistor 5 operates in the low Vds region 20.

Consider now a read operation for the cell of FIG. 1. According to an aspect of the invention the conductors 13 and 14 are pre-charged to a positive potential not exceeding 4 volts while the potential on line 12 is maintained at a value such that transistors 10 and 11 are cut off. After this the potential on line 12 is raised in a positive direction, rendering transistors 10 and 11 conductive. Assuming that lines 13 and 14 are precharged to +4 volts then, as the potential on line 12 is raised towards +V, current will start to flow from line 14 through transistors 11 and 5. This will raise the voltage at output 7. The operating regions of the n-channel transistors are as follows. Transistors 5 and 10 operate in the low Vds region 20 of FIG. 2, as does transistor 11 because the voltage on conductor 14 is limited to 4 volts. Transistor 3 operates in the low Vgs region 19 of FIG. 2 provided that the voltage at output 7 does not exceed (T−0.3) volts (or (T−0.25) volts if relaxation of the relevant condition is permissible). According to the invention the ratio between the channel conductances of the transistors 11 and 5, and the threshold voltage T of transistor 3, are chosen so that this requirement is satisfied, a corresponding choice also being made for the ratio between the channel conductances of the transistors 10 and 3, and the threshold voltage of the transistor 5. Typically the channel widths of transistors 5 and 3 may be chosen to be at least twice the channel widths of the transistors 10 and 11 respectively, if the maximum voltage on the conductors 13 and 14 is 4 volts and the threshold voltages T of the transistors 3 and 5 are 1.0 volt.

Consider now a write operation for the cell of FIG. 1. According to an aspect of the invention, in effect a read operation as described above is first carried out, after which the lines 13 and 14 are made relatively low and relatively high respectively (assuming that a change in the state of the cell is required) while the potential on line 12 is such that transistors 10 and 11 are conductive. Although theoretically it is possible that the drain-source voltage of transistor 10 will exceed 4 volts under these circumstances, in practice this will not be the case since the RC time constant of output 6 will in practice be sufficiently smaller than the RC time constant of the line 13 that the potential on the output 6 will follow that on line 13 as determined by the ratio between the channel conductances of the transistors 2 and 10. While the voltage at output 6 is decreasing, the voltage at output 7 increases, resulting in transistor 3 transitioning from the low Vgs region 19 of FIG. 2 to the low Vds region 20. Transistor 5 similarly transitions from the low Vds region to the low Vgs region. These transitions between the regions 19 and 20 are not abrupt. However they go via the intermediate region 18 of FIG. 2 because, as described above in the context of a read operation, it is arranged that the voltage on the output 6 cannot exceed (T−0.3) volts for the transistor 5 while transistor 5 is cut off, and the voltage on the output 7 cannot exceed (T−0.3) volts for the transistor 3 while transistor 3 is cut off.

A plurality of cells as described with reference to FIGS. 1 and 2 may be arranged in rows and columns to form a matrix of cells, individual ones or groups of which may be selected at will and read or written in response to receipt of an appropriate address and control signal. FIG. 3 shows such an arrangement of n rows and m columns. Each row has a single cell access signal supply conductor 12.1 ... 12.n respectively and each column has a single pair of information signal conductors 13.1, 14.1 ... 13m, 14m respectively. The cell access signal supply conductors are fed from respective outputs A1 ... An of an address decoder 21 via a respective (electronic) switch 22.1 ... 22.n. The power supply conductors 15 and 16 of each cell 1.11 ... 1.mn are fed with 5 volts from appropriate outputs of a power supply 23. The conductors of each pair of information signal conductors 13, 14 are connected to respective inputs of a respective double changeover switch 24.1 ... 24.m. In one position of this switch the conductors are connected to a 4 volts output of supply 23, whereas in the other position they are connected via a respective double switch 25.1 ... 25.m to respective differential outputs of an input buffer 26 and also to respective differential inputs of an output buffer 27. Buffers 26 and 27 are powered with 4 volts and 5 volts respectively from the supply 23. A controller 28 has outputs C, D, E and F which are connected to control inputs of the switches 24, control inputs of the switches 22, an enable input of buffer 26 and an output enable input of buffer 27 respectively.

In the quiescent state the switches are in the positions shown. When a cell access operation is required an appropriate address is supplied to an input 29 of decoder 21, in response to which the decoder generates +5 volts on a selected one of its outputs A1 ... An and a selected one of its outputs B1 ... Bn, the latter closing the corresponding double switch 25. The remaining outputs A and B remain at zero volts. If the required operation is a read operation a signal is also applied to a read control input 30 of controller 28. In response controller 28 first generates a pulse on its output C, changing over the switches 24, and shortly afterwards, while this pulse is still present, generates concurrent pulses on its outputs D and F, closing the switches 22 and enabling the output buffer 27. If on the other hand the required operation is a write operation a signal is supplied to a write control input 31 of controller 28. In response controller 28 first generates a pulse on its output C, changing over the switches 24. Shortly afterwards, and while the pulse on the output C is still present, it generates a pulse on its output D, closing the switches 22. Shortly afterwards, and while the pulses on the outputs C and D are still present, it generates a pulse on its output E, enabling the output of the input buffer 26. It will be noted that, because power is supplied to input buffer 26 at a level of 4 volts, the voltages supplied to the information signal conductors 13, 14 by this buffer cannot exceed this level.

It will be evident that the limit chosen for the maximum positive voltages applied to the information signal conductors 13, 14 will be dependent upon the characteristics of the n-channel transistors employed in the memory cells, this limit in turn determining, together with the threshold voltages of the n-channel transistors 3 and 5 included in the cell CMOS amplifiers, the minimum ratio which the sizes of these transistors 3 and 5 can have to the sizes of the associated transistors 10 and 11.

From reading the present disclosure, other various modifications will be apparent to persons skilled in the art. Such modifications may involve other features which are already known in the design, manufacture and use of arrangements and devices and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalization thereof, whether or not it relates to the same invention as presently claimed in any claim and whether or not it mitigates any or all of the same technical problems as does the present invention.

We claim:

1. A memory comprising a CMOS submicron Static Random Access Memory (SRAM) cell, said cell comprising a pair of cross-coupled inverters, each inverter comprising a series connection of an inverter-PMOS-transistor and an inverter-NMOS-transistor between two supply terminals, a supply voltage being applied across said two supply terminals in operation, outputs of a gate electrode of each of which is coupled to a word line the inverters being coupled to respective bit lines via respective NMOS-access-transistors, the memory further comprising precharging means for precharging said bit lines to a predetermined precharging voltage while impressing a potential on said word line, characterized in that said supply voltage is sufficient, when applied directly across the channel of each individual inverter-NMOS-transistor and NMOS-access-transistor while that transistor is conductive, to result in hot-electron stress in that transistor, said precharging voltage is sufficiently below said supply voltage so as to prevent hot electron stress from occurring in the access-transistors, and the ratio of the channel conductance of the inverter-NMOS-transistor of each of the inverters and the channel conductance of its associated NMOS-access-transistor is such as to keep a voltage representing a low logical level, when such a voltage is present on a respective output of one inverter, below a safety value that is sufficiently below a threshold voltage of the inverter-NMOS-transistor of the other inverter to prevent hot electron stress from occurring in said inverter-NMOS-transistor of the other inverter.

2. A memory as claimed in claim 1, characterized in that said supply voltage is 5 Volts, said precharging voltage lies between 2.5 Volts and 4 Volts, and said safety value is equal to said threshold voltage minus 0.3 Volts.

3. A memory as claimed in claim 1, characterized in that the memory comprises control means for executing each write operation in such manner that it is preceded by precharging.

4. A memory as claimed in claim 1, characterized in that the memory comprises control means for executing each write operation in such manner that it is preceded by a read operation.

5. A memory as claimed in claim 1, characterized in that the width to length ratio (W/L) of each inverter-NMOS-transistor is at least twice the width to length ratio (W/L) of its respective NMOS access-transistor.

6. A memory as claimed in claim 1, characterized in that said threshold voltage is 1.0 Volt.

7. A static random access memory arrangement comprising a plurality of static random access memory cells arranged in rows and columns, each memory cell comprising first and second CMOS inverters which are cross-coupled so as to form an arrangement which in operation has a first stable state in which the potential at an output of the first inverter is positive relative to the potential at an output of the second inverter and a second stable state in which the potential at the output of the second inverter is positive relative to the potential at the output of the first inverter, each inverter comprising a PMOS transistor and an NMOS transistor having their channels connected in series between power supply conductors, and having its output taken from the connection between the two channels, each memory cell further comprising first and second NMOS access transistors, a gate electrode of each of which is connected to a cell access signal supply conductor for the corresponding row and the channels of which connect the outputs of the first and second inverters respectively to first and second information signal conductors for the corresponding column, each of said power supply conductors being connected to an output of power supply means for maintaining a supply voltage between said power supply conductors, and the memory arrangement further including means for charging the information signal conductors to a given potential while impressing a potential on the cell access signal supply conductors, to maintain the access transistors non-conductive, and for subsequently changing the potential on a selected cell access signal supply conductor in a positive direction to switch the access transistors of the cells of the corresponding row to the conductive state and thereby impress upon the corresponding information signal conductors potentials representative of which of the first and second stable states is currently present in each cell of the corresponding row, characterized in that said supply voltage is sufficient, when applied directly across the channel of each individual access and inverter, NMOS transistor while that transistor is conductive, to result in substantial hot-electron stress in that transistor, in that said given potential is sufficiently less than said supply voltage to prevent substantial hot-electron stress from occurring in said access transistors, and in that the ratio of the channel conductance of each inverter NMOS transistor to the channel conductance of the access transistor which is connected to the output of the corresponding inverter is sufficient, as is the threshold voltage of the inverter NMOS transistor of the other inverter of the same cell, to prevent substantial hot-electron stress from occurring in said other inverter NMOS transistor of the same cell.

8. An arrangement as claimed in claim 7, wherein said supply voltage is 5 volts±10%, wherein the maximum value of said given potential is +4 volts±10% relative to the more negative of the power supply conductors, and wherein the threshold voltage of each of the inverter NMOS transistors of each cell and the ratio of the channel conductance of each of the inverter NMOS transistors of each cell to the channel conductance of the access transistor which is connected to the output of the corresponding inverter are such that the gate-source voltage of each of the inverter NMOS transistors of any cell will in operation not exceed the threshold of that transistor less 0.25 volts when a bistable state in which that transistor is non-conductive is present in the corresponding cell and the change in the positive direction occurs in the potential on the corresponding cell access signal supply conductor.

9. A static random access memory arrangement comprising a plurality of static random access memory cells arranged in rows and columns, each memory cell comprising first and second CMOS inverters which are cross-coupled so as to form an arrangement which in operation has a first stable state in which the potential at an output of the first inverter is positive relative to the potential at an output of the second inverter and a second stable state in which the potential at the output of the second inverter is positive relative to the potential at the output of the first inverter, each inverter comprising a PMOS transistor and a NMOS transistor having their channels connected in series between power supply conductors, and having its output taken from the connection between the two channels, each memory cell further comprising first and second NMOS access transistors, a gate electrode of each of which is connected to a cell access signal supply conductor for the corresponding row and the channels of which connect the outputs of the first and second inverters respectively to first and second information signal conductors for the corresponding column, each of said power supply conductors being connected to an output of power supply means for maintaining a supply voltage between said power supply conductors, and the memory arrangement further including potential impressing and changing means for impressing respective potentials, one of which is more positive than the other, on the information signal conductors of a given column and changing the potential on the cell access conductor of a selected row in a positive direction to switch the access transistors of the cells of the corresponding row to the conductive state so that the stable state which is present thereafter in the cell which is situated in the selected row and the given column is representative of which of the information signal conductors of the given column carries the more positive potential, characterized in that said supply voltage is sufficient, when applied directly across the channel of each individual access and inverter NMOS transistor while that transistor is conductive, to result in substantial hot-electron stress in that transistor, in that said potential impressing and changing means is arranged to carry out the change in the potential on the selected cell access conductor in a positive direction prior to the impressing of the said respective potentials on the given information signal conductors, in that the arrangement includes means for charging the given information signal conductors to a given potential prior to the change in the potential on the selected cell access conductor in a positive direction, and in that said given potential and the more positive of said respective potentials are both sufficiently less than said supply voltage to prevent substantial hot-electron stress from occurring in said access transistors, and in that the ratio of the channel conductance of each inverter NMOS transistor to the channel conductance of the access transistor which is connected to the output of the corresponding inverter is sufficient, as is the threshold voltage of the inverter NMOS transistor of the other inverter of the same cell, to prevent substantial hot electron stress from occurring in said other inverter NMOS transistor of the same cell.

10. An arrangement as claimed in claim 9, wherein said supply voltage is 5 volts ± 10%, wherein the maximum value of said given potential and the more positive of said respective potentials are +4 volts ± 10% relative to the more negative of the power supply conductors, and wherein the threshold voltage of each of the inverter NMOS transistors of each cell and the ratio of the channel conductance of each of the inverter NMOS transistors of each cell to the channel conductance of the access transistor which is connected to the output of the corresponding inverter are such that the gate-source voltage of each of the inverter NMOS transistors of any cell will in operation not exceed the threshold voltage of that transistor less 0.25 volts when a bistable state in which that transistor is non-conductive is present in the corresponding cell and the change in the positive direction occurs in the potential on the corresponding cell access signal supply conductor.

* * * * *